US011308990B1

(12) United States Patent
Mendonsa et al.

(10) Patent No.: US 11,308,990 B1
(45) Date of Patent: Apr. 19, 2022

(54) SELECTIVELY ROUTING SIGNALS TO DATA STORAGE DEVICES WITHIN A DATA STORAGE SYSTEM THAT INCLUDES A MOVABLE CARRIAGE

(71) Applicant: Seagate Technology LLC, Freemont, CA (US)

(72) Inventors: Riyan Mendonsa, Edina, MN (US); Brett Herdendorf, Mound, MN (US); Krishnan Subramanian, Shakopee, MN (US); Jon Trantham, Chanhassen, MN (US)

(73) Assignee: Seagate Technology LLC, Freemont, CA (US)

(*) Notice: Subject to any disclaimer, the term of this patent is extended or adjusted under 35 U.S.C. 154(b) by 0 days.

(21) Appl. No.: 17/072,930

(22) Filed: Oct. 16, 2020

(51) Int. Cl.

| | |
|---|---|
| ***G11B 33/12*** | (2006.01) |
| ***G11B 19/28*** | (2006.01) |
| ***H05K 5/02*** | (2006.01) |
| *G11B 17/22* | (2006.01) |
| *H05K 7/14* | (2006.01) |

(52) U.S. Cl.

CPC ............ *G11B 19/28* (2013.01); *G11B 33/126* (2013.01); *G11B 33/127* (2013.01); *G11B 33/128* (2013.01); *H05K 5/0247* (2013.01); *H05K 5/0256* (2013.01); *G11B 17/225* (2013.01); *H05K 7/1492* (2013.01)

(58) Field of Classification Search

None

See application file for complete search history.

(56) References Cited

U.S. PATENT DOCUMENTS

| | | | | |
|---|---|---|---|---|
| 5,059,772 | A | 10/1991 | Younglove | |
| 5,870,245 | A | 2/1999 | Kersey et al. | |
| 7,180,701 | B2 | 2/2007 | Armagost et al. | |
| 8,328,571 | B2 * | 12/2012 | Mulfinger | H01R 12/737 439/260 |
| 9,743,547 | B1 * | 8/2017 | Amin-Shahidi | G11B 33/08 |
| 10,446,186 | B1 | 10/2019 | Mendonsa et al. | |
| 10,902,879 | B2 * | 1/2021 | Mendonsa | G06F 3/0611 |
| 10,996,900 | B2 * | 5/2021 | Mendonsa | G11B 5/5569 |
| 2003/0040836 | A1 * | 2/2003 | Deckers | G11B 17/225 700/214 |
| 2006/0010275 | A1 | 1/2006 | Moon et al. | |
| 2010/0028110 | A1 * | 2/2010 | Todd | G11B 17/225 414/267 |
| 2011/0285264 | A1 * | 11/2011 | Schmidtke | G11B 15/6835 312/309 |
| 2013/0262904 | A1 * | 10/2013 | Kazama | G06F 1/3221 713/340 |

(Continued)

*Primary Examiner* — Jefferson A Evans

(57) ABSTRACT

An apparatus includes a housing, a data storage magazine configured to hold a plurality of data storage devices, and a movable carriage disposed within the housing that is configured to selectively couple the data storage devices to a host device. The data storage magazine includes a set of magazine signal paths configured to provide signals to the plurality of data storage devices. The movable carriage includes a set of carriage signal paths configured to provide signals to the plurality of data storage devices. The apparatus includes a controller configured to power the plurality of data storage devices by selectively routing the signals via the set of magazine signal paths or the set of carriage signal paths.

20 Claims, 11 Drawing Sheets

100
HOST COMPUTING SYSTEM 102
104
106C
106B
106A
110
108
120
126
ACTUATION SYSTEM 122
CHASSIS CONTROLLER 124
COMM. UNIT 128
POWER SOURCE 130

(56) References Cited

U.S. PATENT DOCUMENTS

| | | | | |
|---|---|---|---|---|
| 2014/0055959 | A1* | 2/2014 | Manda | H05K 7/1487 361/728 |
| 2014/0203696 | A1* | 7/2014 | Rust | G11B 33/128 312/330.1 |
| 2014/0204537 | A1* | 7/2014 | Rust | H05K 7/02 361/727 |
| 2015/0359115 | A1* | 12/2015 | Hirano | G11B 33/08 361/679.34 |
| 2015/0362968 | A1 | 12/2015 | Jurey et al. | |
| 2019/0243551 | A1* | 8/2019 | Xu | G06F 11/3055 |
| 2019/0258011 | A1* | 8/2019 | Pitwon | H04L 41/12 |
| 2019/0269040 | A1* | 8/2019 | Gao | H05K 7/1488 |
| 2020/0272367 | A1 | 8/2020 | Mendonsa et al. | |
| 2020/0301619 | A1 | 9/2020 | Mendonsa et al. | |
| 2020/0302966 | A1 | 9/2020 | Herdendorf et al. | |
| 2021/0082467 | A1* | 3/2021 | Herdendorf | G11B 33/0466 |

* cited by examiner 438
442
448
430
436
444
410
434
432
420

444
436
434
432
410
400

500
502
510A
510B
512A
512B
528
530
532
534
536
540
542
544
546
548
x
y x
y
500
502
510A
510B
512A
512B
528
530
532
534
536
540
542
544
546
548

510B
510A
536
540
530
512B
546
542
548
528
512A
534
500
502
544
532
x
y 700
708B
708A
720
740B
716B
712B
714B
710B
740A
716
716A
712A
714A
710A
728
730
742
726

SELECTIVELY ROUTING SIGNALS TO DATA STORAGE DEVICES WITHIN A DATA STORAGE SYSTEM THAT INCLUDES A MOVABLE CARRIAGE

TECHNICAL FIELD

The disclosure relates to a data storage system.

BACKGROUND

Data storage systems often include numerous data storage devices stored within a cabinet or rack. In some examples of online data storage devices, all of the data storage devices are continuously communicatively coupled to a host device, such that the host device may access data from any or all of the data storage devices at any given time. In such examples, the data storage devices may generate large amounts of heat and consume enormous amounts of power (e.g., powering and cooling the data storage devices). In some cold or offline data storage examples, data storage devices (e.g., tapes) are stored such that the data storage devices must be retrieved and loaded into another device to read and write data. In such examples, the time to data may take tens of seconds to multiple minutes. The computational storage landscape spans a vast range of archival space with incumbent options for storage ranging from so-called 'glacial' or 'cold' storage (e.g., microfiche, tape, or optical storage) to 'hot' storage (e.g., a continuously online hard drive or flash storage). Time to data (TTD) decreases as the migration from glacial to warm storage is made but there is a corresponding increase in cost with such a migration. For example, decreasing TTD typically increases power consumption.

SUMMARY

The present disclosure describes a data storage system configured to store a plurality of data storage devices and a movable carriage configured to selectively couple to various sets of plurality of data storage devices. In one example, the data storage system includes a housing configured to store a plurality of data storage magazines in rows. Each data storage magazine is configured to hold or support a plurality of data storage devices. The housing also includes a movable carriage that selectively couples a host device to the data storage devices of a particular data storage magazine. In contrast to examples where all of the data storage devices are continuously coupled to a host device, selectively coupling various data storage devices to the host device may reduce the amount of power consumed by the data storage devices and may reduce the amount of heat generated by the data storage devices, which may reduce the energy and cost of cooling the data storage devices. Utilizing a movable carriage to selectively couple to the various data storage devices may decrease the time to data relative to some data storage techniques (e.g., cold storage systems, such as tape archival systems) while consuming less power than some other data storage techniques (e.g., always online data storage systems).

In one example, an apparatus includes a housing, a data storage magazine configured to hold a plurality of data storage devices, and a movable carriage disposed within the housing that is configured to selectively couple the data storage devices to a host device. The data storage magazine includes a set of magazine signal paths configured to provide signals to the plurality of data storage devices. The movable carriage includes a set of carriage signal paths configured to provide signals to the plurality of data storage devices. The apparatus includes a controller configured to power the plurality of data storage devices by selectively routing the a signal via the set of magazine signal paths or the set of carriage signal paths.

In another example, a method includes, while a movable carriage is decoupled from a plurality of data storage devices held by a data storage magazine, providing current to the plurality of data storage devices via a set of magazine signal paths of the data storage magazine. The method also includes coupling the movable carriage to the plurality of data storage devices, and responsive to coupling the movable carriage to the plurality of data storage devices, providing the current to the plurality of data storage devices via a set of carriage signal paths of the movable carriage.

In another example, a device includes a processor and a memory. The memory includes instructions that, when executed by the processor, cause the processor to selectively route current to a plurality of data storage devices held by a data storage magazine by routing the current via a set of carriage signal paths of a movable carriage when the movable carriage is coupled to the plurality of data storage devices and routing the current via a set of magazine signal paths of the data storage magazine when the movable carriage is not coupled to the plurality of data storage devices.

These and other features and aspects of various examples may be understood in view of the following detailed discussion and accompanying drawings.

DETAILED DESCRIPTION

Figure 1:
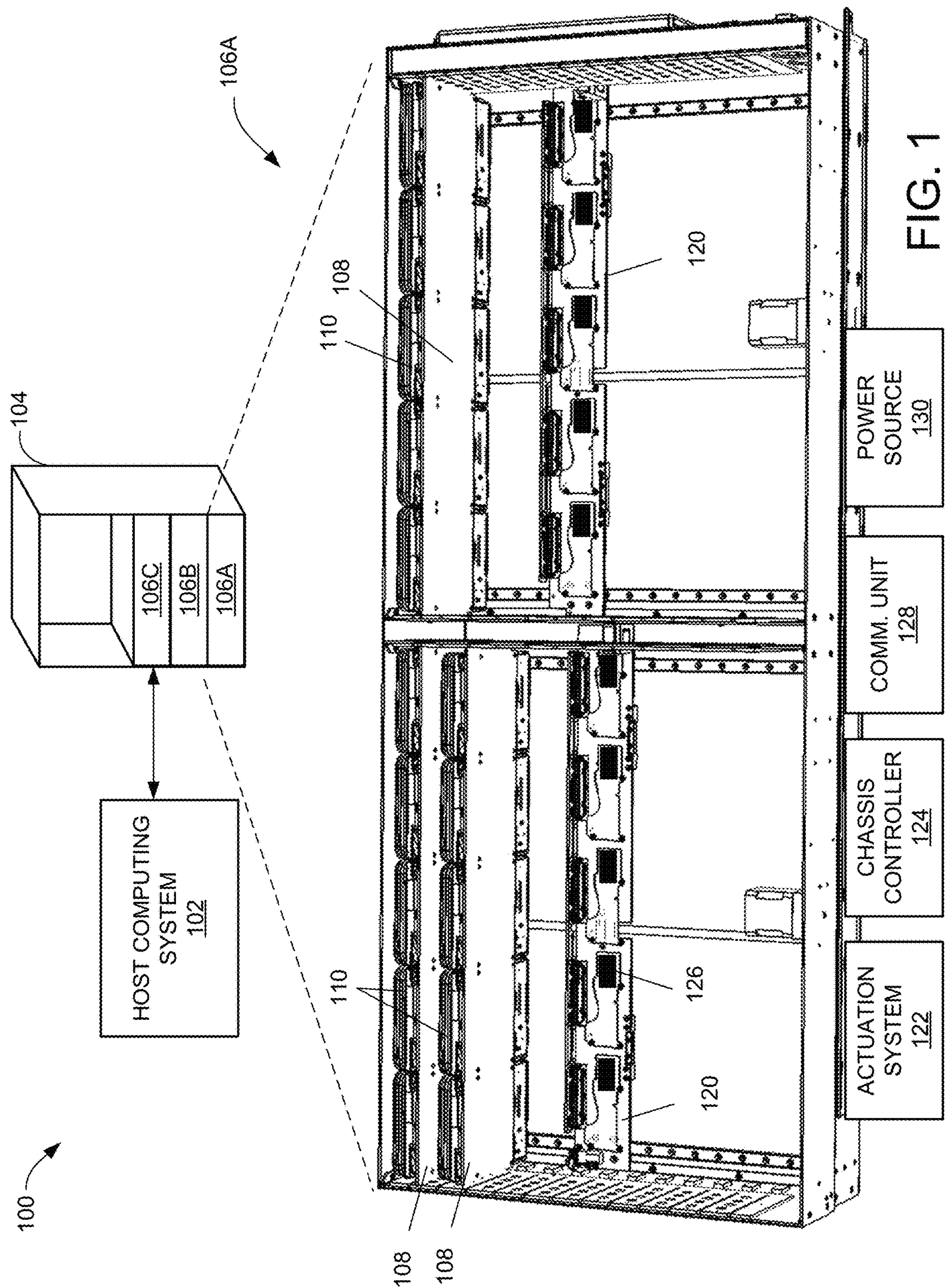
FIG. 1 illustrates an example nearline data archival system configured to selectively couple data storage devices to a host computing device, in accordance with one or more aspects of the present disclosure.

FIG. 1 illustrates an example data storage system configured to selectively couple data storage devices to a host computing device, in accordance with one or more aspects of the present disclosure. System 100 includes host computing system 102 and data storage rack 104. In some examples, system 100 is configured to maintain some or all of data storage devices 110 in an off or low power state until selectively powered and/or accessed by carriage 120. In other words, in contrast to online storage where all of the data storage devices are immediately available for reading and writing data, some data storage devices within system 100 may not be immediately available for reading and writing data, but can be brought online relatively quickly (e.g., compared to offline data storage) with minimal or no human intervention.

Host computing system 102 represents any type of computing system that is configured to read data from and write data to a data storage device. Examples of host computing system 102 include cloud computing environments, servers, desktop computers, laptop computers, mobile phones, tablet computers, televisions, automobiles, or any other type of mobile or non-mobile computing device that is configured to read and write data.

Data storage rack 104 includes a plurality of chassis 106A-106C (collectively, chassis 106). In some examples, each chassis 106 is removable from data storage rack 104. Each chassis 106 is configured to store a plurality of data storage magazines 108 and data storage devices 110.

In some examples, each data storage magazine 108 is configured to hold or support at least one data storage device 110. In one example, each data storage magazine holds a plurality of data storage devices 110 (e.g., in a row or other arrangement). In the example of FIG. 1, each data storage magazine 108 is configured to hold five data storage devices 110. However, data storage magazines 108 may hold additional or fewer data storage devices 110. In some examples, data storage magazines 108 are configured to be insertable into, and removable from, a housing of chassis 106. In one example, data storage magazines 108 are fixed within (e.g., integral with) the housing of chassis 106. Data storage magazines 108 may include metal (e.g., aluminum, stainless steel, or other metal), printed circuit board (PCB), and/or other rigid material.

Data storage devices 110 store data, such as data received from host computing system 102. Examples of data storage devices 110 include hard disk drives (HDDs), solid state drives (SSDs), and magnetic tape drives, among others. Each data storage device 110 includes a drive interconnect configured to physically, electrically, and communicatively couple the respective data storage device 110 to a corresponding carriage interconnect of carriage 120.

In some examples, each data storage chassis 106 includes at least one carriage 120, an actuation system 122, a communication (comm.) unit 128, and a power source 130. Communication unit 128 communicates with host computing system 102 via one or more wired and/or wireless communication protocols. Examples of communication unit 128 include an optical transceiver, radio frequency transceiver, a network card (e.g., an Ethernet card), among others. Examples of power source 130 include a battery and a power supply unit, among other examples.

Actuation system 122 is configured to move carriage 120 within chassis 106. Actuation system 122 includes a motor that propels the carriage 120 in one or more directions across a stage. The stage may be, for example, a rail, a cable pulley, or other track usable to guide movement of carriage 120. Examples of actuation system 122 include a linear motion actuator (e.g., a rack and pinion linear actuator), a belt-driven linear actuator, a V-guide rail and wheel system, or a screw rail actuator and screw rail guide, among others. In some examples, actuation system 122 includes one or more position sensors configured to detect the position of carriage 120 within chassis 106. Examples of position sensors include hall effect sensors, inductive sensors, linear variable differential transformers, position encoders, piezo-electric transducers, among others.

Carriage 120 (also referred to as movable carriage 120) is configured to communicatively and electrically couple data storage devices 110 to host computing system 102. In one example, carriage 120 is configured to selectively couple host computing system 102 to a set of data storage devices 110 that are physically coupled to a particular data storage magazine 108. That is, in some examples, each carriage 120 selectively couples host computing system 102 to a single row of data storage devices 110 at any particular time. For example, actuation system 122 may move carriage 120 from one set of data storage devices 110 (e.g., a particular row of data storage devices 110 attached to a particular data storage magazine 108) to another set of data storage devices 110 (e.g., another row of data storage devices 110 that are attached to another data storage magazine 108).

In some examples, chassis 106 includes one or more chassis controllers 124 and one or more drive controllers 126. While carriage 120 includes drive controllers 126 in the example of FIG. 1, in some examples, data storage devices 110 include drive controllers 126. In some examples, data storage rack 104 may include chassis controllers 124 and/or drive controllers 126.

In some examples, chassis controllers 124 and drive controllers 126 include hardware, hardware and software, hardware and firmware, or a combination thereof suitable to perform the techniques attributed to chassis controllers 124 and drive controllers 126. Examples of controllers include processors, microprocessors, peripheral interface controllers ("PICs"), application-specific integrated circuits ("ASICs"), systems on chips ("SoCs"), field programmable gate arrays (FPGAs), etc.

While not shown in FIG. 1, chassis controllers 124 and drive controllers 126 may include tangible memory configured to store data, such as non-volatile memory (e.g., flash memory, solid state devices (SSDs), hard disk drives (HDDs)), or volatile memory (e.g., random access memory (RAM)). It should be understood, however, that memory does not include connections, carrier waves, signals, or other transient signal transport mechanism, but are instead directed to non-transient, tangible memory. In some examples, the memory may be external to one or more controllers (e.g., may be external to a package in which one or more controllers are housed). The memory may store computer-executable instructions which may be executed by a processor to perform the functionality of the processor.

Drive controllers 126 are communicatively coupled to carriage 120 and are configured to control read/write circuitry and mechanics of data storage devices 110. Read/write circuitry includes circuitry that powers and/or facilitates data access (e.g., read and/or write access) to data storage devices 110. Read/write circuitry may include a preamplifier, a slider (e.g., including a reader, a writer, and/or a heater), a microactuator, or any other component that powers or facilitates data access to data storage devices 110. Mechanics may include devices that facilitate or prevent motion of components in data storage devices 110, such as motors (e.g., spindle motors), voice coils, ramps, or suspensions. In some examples, a spindle motor rotates the magnetic recording media of data storage devices 110.

Chassis controller 124 controls actuation system 122 to regulate movement of carriage 120. In one example, chassis controller 124 may output one or more commands to move between data storage magazines 108. For example, the commands cause carriage 120 to move from a first position that enables carriage 120 to communicatively and electrically couple to one set of data storage devices 110 to a different position that enables carriage 120 to communicatively and electrically couple to another set of data storage devices 110. In some examples, data storage devices 110 that are not communicatively coupled to carriage 120 may be in a low-power state or an off-state (e.g., powered off), and may be powered to full power or near full power when communicatively and electrically coupled to carriage 120.

In this way, techniques of this disclosure may enable movable carriage 120 to selectively couple to different sets of data storage devices. Moving carriage 120 between sets of data storage devices 110 may enable host computing system 102 to access data storage devices 110 more quickly than offline data storage techniques, while potentially reducing the amount of energy consumed by data storage devices 110 relative to online data storage techniques.

Figure 2:
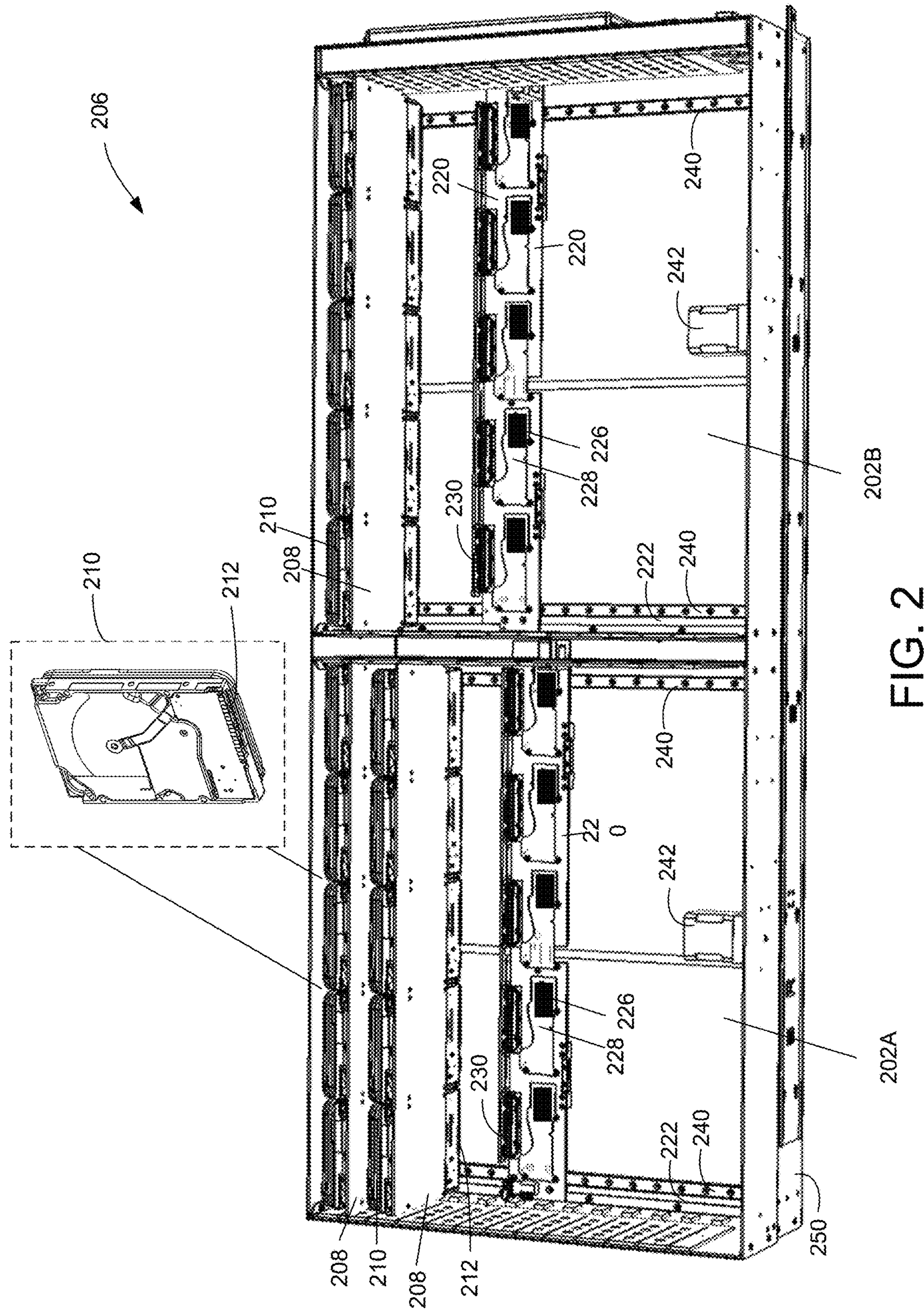
FIG. 2 is a perspective view of an example data storage chassis, according to various aspects of the present disclosure.

FIG. 2 is a perspective view of an example data storage chassis, according to various aspects of the present disclosure. Chassis 206 is configured to store a plurality of data storage magazines 208 and data storage devices 210. In the example of FIG. 2, chassis 206 is divided into a plurality of compartments 202A and 202B (collectively, compartments 202) that are each configured to store a plurality of data storage magazines. Chassis 206 may include more or fewer compartments 202. While chassis 206 is illustrated as storing two data storage magazines 208 in a first compartment 202A and one data storage magazine 208 in the second compartment 202B, chassis 206 may be configured to store any number of data storage magazines (e.g., 10, 15, 20, or more data storage magazines within each compartment 202). Each data storage magazine 208 is configured to hold or support a plurality of data storage devices 210 (e.g., in rows). While FIG. 2 illustrates data storage magazines 208 supporting data storage devices 210 in rows, in some examples data storage magazines 208 may hold data storage devices 210 in different orientations or configurations. In some examples, chassis 206 is configured to store individual data storage devices 210.

In some examples, data storage devices 210 include a plurality of HDDs that each include a housing enclosing rotatable magnetic recording media (e.g., disks) and at least one data read/write transducer (e.g., a head). In some examples, data storage devices 210 may include SSDs, magnetic tape, or other data storage device. Each of data storage devices 210 include a drive interconnect 212 configured to physically and communicatively couple the respective data storage device 210 to a corresponding carriage interconnect 230 of carriage 220. In the example of FIG. 2, drive interconnects 212 and carriage interconnects 230 are configured to communicatively couple data storage devices 210 and carriage 220 via an interface, such as a serial advanced technology attachment (SATA) interface, a serial attached small computer system interface (SAS), a peripheral component interconnect express (PCIe) interface, a universal serial bus ("USB") interface, or any other type of interface.

Chassis 206 includes housing 250 configured to slide in and out of a stowed position within a data storage rack (e.g., data storage rack 104 of FIG. 1). Housing 250 may include a metal (e.g., stainless steel, aluminum, or other metal), plastic, PVC, or any other material suitable for storing data storage devices 210 within a data storage rack. In some examples, chassis 206 is adapted to fit within or otherwise have overall dimensions that correspond to an industry standard data storage rack (e.g., a 42 U rack), or with other suitable dimensions to facilitate integration into existing data storage environments such as magnetic tape-based solutions.

Each compartment 202 of chassis 206 includes at least one movable carriage 220, at least one flexible cable 222, and a motor 242 configured to move carriage 220 within housing 250. In the example of FIG. 2, motors 242 moves carriages 220 within housing 250 by propelling carriage 220 along a first axis of stage 240. Examples of motors 242 include a brushless motor, a brushed motor, a direct drive motor, linear motor, servo motor, stepper motor, etc. Stage 240 may include, for example, a rail, a cable pulley, or other track usable to guide movement of carriage 220 relative to housing 250. In some instances, each carriage 220 is disposed between data storage magazines 208 and a bottom surface of housing 250 and traverses stage 240 between data storage magazines 208 and the bottom surface of housing 250.

In some examples, flexible cable 222 communicatively and electrically couples carriage 220 to a host device (e.g., host computing system 102 of FIG. 1) via a chassis controller (e.g., chassis controller 124 of FIG. 1). In one example, flexible cable 222 is configured to power and exchange data with carriage 220. For example, flexible cable 222 may transmit current to operate data storage devices 210, couple/de-couple carriage interconnects 230 from drive interconnects 212, or both. While illustrated as a flexible cable, in some examples, chassis 206 communicatively couples carriage 220 to the host via an optical system, microwaves system, or other communication system.

In some examples, each carriage 220 is configured to selectively couple to a set of data storage devices 210. In other words, each carriage 220 is configured to selectively couple the host computing system to a set of data storage devices 210 that are held by a particular data storage magazine. Said yet another way, each carriage 220 selectively couples to a single row of data storage devices 210 that are all coupled to the same data storage magazine 208. In some examples, the quantity of interconnects on the movable carriage is equal to the number of data storage devices that each data storage magazine is configured to hold. For example, each carriage 220 includes a plurality of carriage interconnects 230 that are configured to communicatively couple to a respective drive interconnect 212. In one example, each carriage interconnect 230 couples to a respective drive interconnect 212 of a set of data storage devices 210 (e.g., two, three, four, five, or more adjacent data storage devices 210) at a particular time to provide parallel (e.g., simultaneous) data access to each of the data storage devices 210 in the set (e.g., a set of data storage devices held by a particular data storage magazine). In some instances, each carriage 220 operates independently such that each carriage 220 may couple to a different row of data storage devices 210. By coupling carriage 220 to a particular set of data storage devices 210 held by a single data storage magazine 208, carriage 220 powers (e.g., power-on, power-off, spin-up, spin-down, etc.) that particular set of data storage devices 210 without powering each of the data storage devices 210 within the chassis 206, which may reduce the amount of energy consumed by data storage devices 210. This system-configuration permits the individual data storage devices to be individually removed, serviced, and/or replaced without affecting a flow of data to or from any of the other data storage drives sharing the same control electronics (e.g., the components on PCB 228).

Carriages 220 may each include a plurality of drive controllers 226. For example, data storage devices 210 may not include drive controllers to control read/write circuitry of the respective data storage devices and may include an interposer that transmits data and signals between the read/write circuitry of data storage devices 210 and drive controllers 226 of carriages 220. In the example of FIG. 2, carriage 220 includes five drive controllers 226 that are each disposed on a respective PCB 228. Carriage 220 may include fewer or additional drive controllers 226. While carriage 220 is illustrated as including drive controllers 226, in some instances, each of data storage devices 210 includes drive controllers 226. In such instances, PCBs 228 may represent an interposer that transmits data and commands to/from data storage devices 210 and a chassis controller (e.g., a server or rack-level controller).

In operation, the chassis controller transmits data access commands (e.g., read and/or write commands) to carriage 220 via flexible cable 222. The data access commands may specify target logical block addresses (LBA) for executing associated data access operations. Responsive to receiving a data access command, the chassis controller identifies one or more physical data storage devices 210 located within chassis 206 that corresponds to the target LBAs using a stored logical-to-physical block map. The chassis controller outputs a signal to cause motor 242 to robotically propel carriage 220 across stage 240 to a particular position suitable for accessing the identified data storage devices 210.

Carriage 220 couples to a set of data storage devices 210 (e.g., a row of data storage devices 210 attached to a particular data storage magazine 208) when carriage 220 reaches the particular position. In some examples, carriage 220 lifts carriage interconnects 230 towards drive interconnects 212 to communicatively and electrically couple the set of data storage devices 210 to carriage 220.

In some examples, the chassis controller outputs the data access command to one or more drive controllers 226. Drive controllers 226 may receive the data access commands and may control the read/write circuitry of the set of data storage devices 210 in response to receiving the data access commands.

In accordance with techniques of this disclosure, a movable carriage may selectively couple a set of data storage devices to a host computing system. Selectively coupling a set of the data storage devices stored within a chassis may enable some of the data storage devices to be powered down or in a low powered state, which may reduce the amount of energy consumed by the data storage devices. Utilizing a movable carriage may enable a host computing system to access data storage devices relatively quickly compared to offline data storage systems, which may increase read and write operations.

Figure 3:
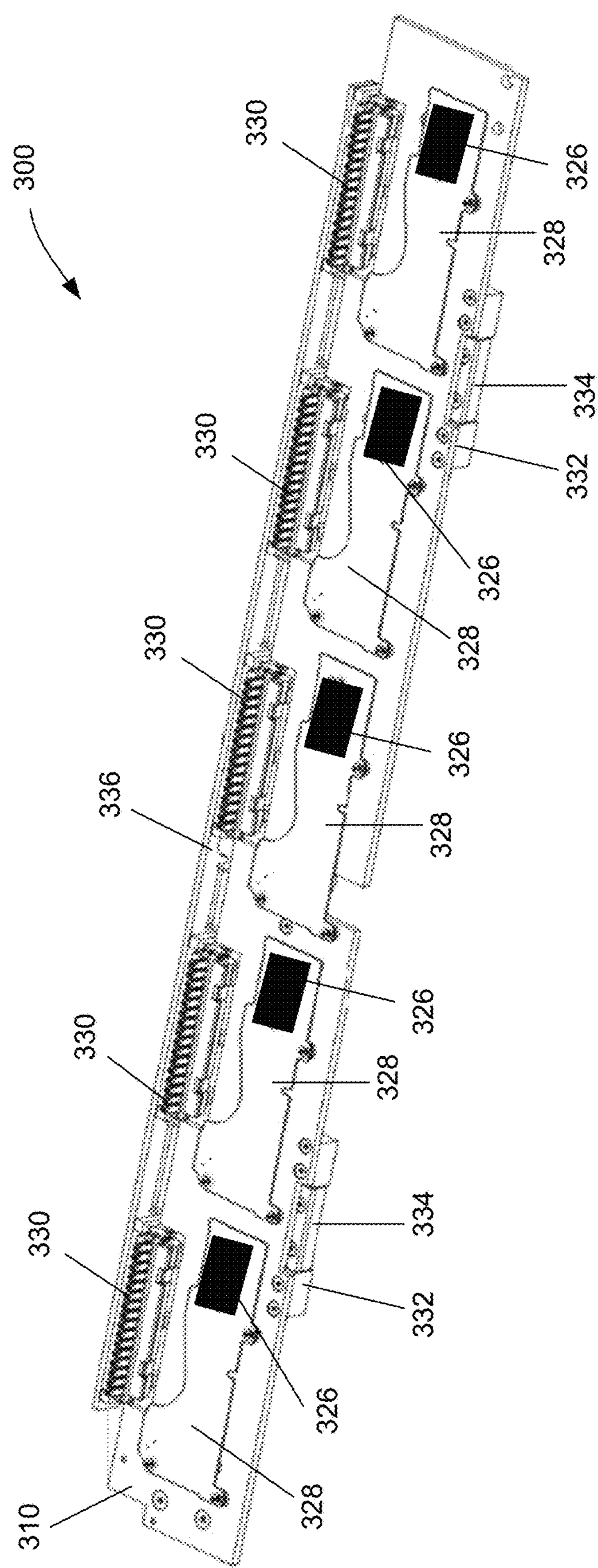
FIG. 3 is a top perspective view of a movable carriage, in accordance with various aspects of the present disclosure.

FIG. 3 is a top perspective view of a movable carriage, in accordance with various aspects of the present disclosure. Carriage 300 (also referred to as movable carriage 300) includes a baseplate 310, a plurality of PCBs 328 disposed on a top surface of baseplate 310, and a plurality of carriage interconnects 330.

In the example of FIG. 3, each of PCBs 328 includes a respective drive controller 326 communicatively coupled to a respective carriage interconnect 330. Each drive controller 326 is configured to receive data access commands (e.g., read commands and/or write commands) from a host computing system (e.g., host computing system 102 of FIG. 1) and output control signals to a respective data storage device in response to receiving the data access commands. For example, drive controller 326 may output a control signal (e.g., a read signal, a write signal, or a heater activation signal) to control the slider of a data storage device. As one example, each of drive controllers 326 may output a write signal to the slider of a given data storage device via a respective carriage interconnect 330 to cause the data storage device to write data.

While FIG. 3 illustrates PCBs 328 as including drive controllers 326, in some scenarios, PCBs 328 are configured to route data access commands to a drive controller of a data storage device. That is, in some scenarios, PCBs 328 may be interposer devices that do not include drive controllers and that relay data access commands from the host computing system to drive controllers located on the data storage devices. PCBs 328, can also be a single PCB configured to interact with one or more data storage devices simultaneously.

Carriage 300 includes tilt bar backplate 336. In one example, tilt bar backplate 336 is disposed on a proximal side of carriage 300. Tilt bar backplate 336 is physically coupled (e.g., directly coupled) to each of carriage interconnects 330.

Carriage 300 includes one or more tilt bar hinges 332 and one or more tilt bar pivot points 334. Tilt bar hinges 332 and tilt bar pivot points 334 are located on a distal side of carriage 300 that is opposite the proximal side of carriage 300. While FIG. 3 illustrates two tilt bar hinges 332 and two tilt bar pivot points 334, carriage may include fewer or additional tilt bar hinges and pivot points in some examples. Examples of tilt bar hinges 332 include dowel hinges, flexure hinges, flush hinges, and pivot hinges, among other types of hinges.

Figures 4A, 4B:
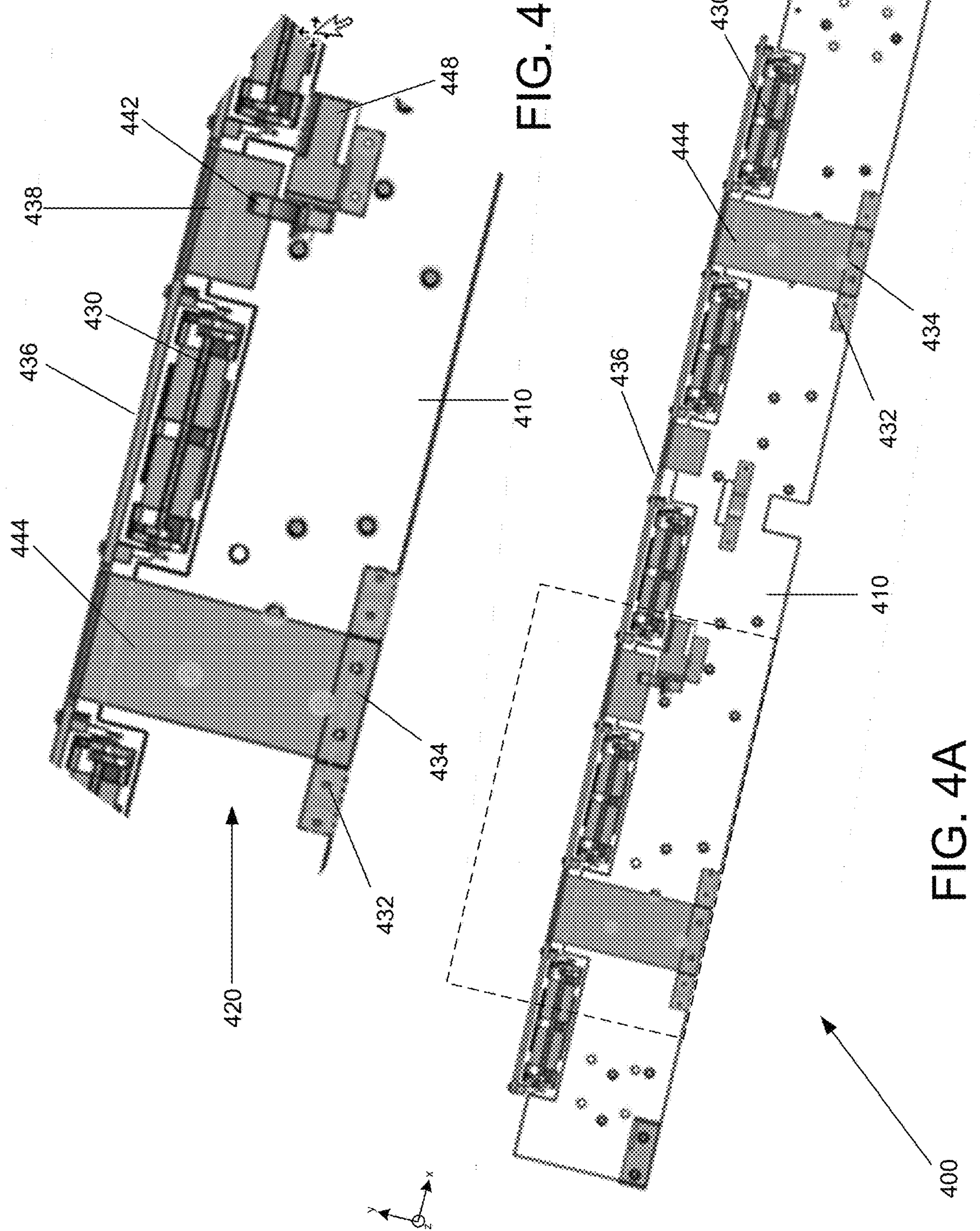
FIG. 4A is a bottom perspective view of an example movable carriage, in accordance with various aspects of the present disclosure.
FIG. 4B is a zoomed-in bottom perspective view of a portion of the movable carriage of FIG. 4A.

In one example, tilt bar backplate 336 is rotatably coupled to tilt bar hinges 332 via a respective tilt bar extension disposed beneath baseplate 310 (see FIGS. 4A and 4B). Tilt bar hinges 332 rotate about tilt bar pivot points 334 to move (e.g., raise and lower) carriage interconnects 330 vertically relative to baseplate 310.

Tilt bar hinges 332 rotate about pivot points 334 to connect and disconnect carriage interconnects 330 from data storage devices 210 of FIG. 2. In one example, tilt bar hinges 332 rotate towards a bottom surface of the housing of chassis 206 of FIG. 2 thereby moving carriage interconnects 330 vertically away from data storage devices (e.g., lowering carriage interconnects 330 from the data storage devices). For example, a controller (e.g., chassis controller 124) may disconnect carriage interconnects 330 from the respective data storage devices 210 by outputting a command causing tilt bar hinges 332 to rotate about tilt bar pivot points 334 away from data storage devices 210, which may lower carriage interconnects 330 from the data storage devices 210. In another example, the controller may connect carriage interconnects 330 to data storage devices 210 by outputting a command causing tilt bar hinges 332 to rotate about tilt bar pivot points 334 towards data storage devices 210. In this way, the controller communicative couples and decouples carriage interconnect 330 with drive interconnects 212 of data storage devices 210 of FIG.

FIG. 4A is a bottom perspective view of an example movable carriage, in accordance with various aspects of the present disclosure. FIG. 4B is a zoomed-in bottom perspective view of a portion of the movable carriage of FIG. 4A. Carriage 400 (also referred to as movable carriage 400) includes a baseplate 410, a plurality of carriage interconnects 430, and at least one tilt bar 420.

Tilt bar 420 includes tilt bar hinge 432, tilt bar pivot point 434, tilt bar backplate 436, tilt bar tab 438 and tilt bar extension 444. In one example, tilt bar hinge 432 and tilt bar pivot point 434 are located on a distal side of carriage 400.

In some examples, tilt bar backplate 436 is physically coupled to carriage interconnects 430 on the proximal side of carriage 400.

In one example, tilt bar backplate 436 is configured to rotate about pivot point 434. For example, as illustrated in FIGS. 4A and 4B, tilt bar backplate 435 is rotatably coupled to tilt bar hinge 423 via tilt bar extension 444. In one example, tilt bar extension 444 is mechanically coupled to tilt bar backplate 436 on a proximal side of carriage 400 and tilt bar hinges 432 on the distal side of carriage 400. That is, in some examples, tilt bar extension 444 extends across the bottom surface of baseplate 410 and mechanically couples tilt bar backplate 436 with tilt bar hinges 432 and tilt bar pivot point 434 to enable tilt bar backplate 436 to rotate about pivot point 434. Tilt bar backplate 436 and tilt bar extension 444 may include metal (e.g., stainless steel, aluminum, or any other suitable material).

In some examples, tilt bar 420 includes tilt bar tab 438. Tilt bar tab 438 may be located on a proximal side of carriage 400. For example, as shown in FIGS. 4A and 4B, tilt bar tab 438 is mechanically coupled to tilt bar backplate 436 and protrudes from tilt bar backplate 436 across a portion of the bottom surface of baseplate 410.

In the example of FIG. 4B, tilt bar 420 includes tilt arm 442 and tilt arm motor 448. Tilt arm 442 is configured to raise and/or lower tilt bar backplate 436 to couple carriage interconnects 430 to, and decouple carriage interconnects 430 from drive interconnects. For example, tilt arm motor 448 is physically coupled (e.g., directly coupled) to tilt arm 442 and may rotate tilt arm 442 towards tilt bar tab 438, which may cause tilt bar tab 438 to lift tilt bar backplate 436 (and hence carriage interconnects 430) towards a set of data storage devices and the respective drive interconnects. Both tilt arm 442 and tilt arm motor 448 are disposed on a bottom surface of baseplate 410 on the proximal side of carriage 400 (e.g., opposite the distal side of carriage 400). While FIG. 4B. illustrates a single tilt arm 442 and a single tilt arm motor 448, tilt bar 420 may, in some examples, include additional tilt arms and tilt arm motors.

In operation, in some examples, after chassis controller 124 of FIG. 1 outputs commands signals to cause motor 242 of FIG. 2 to robotically propel carriage 400 across stage 240 of FIG. 2 to a target position along the X-Y plane (e.g., a position beneath a row of data storage devices 210 for accessing the row of data storage devices 210), chassis controller 124 of FIG. 1 further commands tilt arm motor 448 to engage and rotate tilt arm 442. That is, chassis controller 124 may output a command causing motor 448 to rotate tilt arm 442. Tilt arm 442 rotates (e.g., around the X-axis) causing tilt arm 442 to physically contact tilt bar tab 438. In the examples of FIGS. 4A and 4B, tilt arm 442 is shown in its rotated orientation and is in physical contact with tilt bar tab 438. Tilt arm 442 rotates about the x-axis and drives tilt bar tab 438 towards data storage devices 210 (e.g., in the Z-direction), which causes tilt bar extension 444 to rotate around tilt bar pivot point 434. Rotating tilt bar extension 444 about tilt bar pivot point 434 extends (e.g., lifts) tilt bar backplate 436 (and hence carriage interconnects 430) away from the top surface of baseplate 410 towards data storage device 210. In some examples, rotating tilt bar backplate 436 results in almost vertical displacement of carriage interconnects 430 due to the short angle of rotation about pivot point 434 relative to the length of tilt bar extension 444. While the examples of FIGS. 4A and 4B illustrate carriage interconnects 430 moving vertically by rotating tilt bar extension 444 and tilt bar backplate 436 around tilt bar pivot point 434, other methods of vertical translation may be used in some examples.

FIGS. 5A-5D represent side views of a data storage chassis including a movable carriage, in accordance with various aspects of the present disclosure. Data storage chassis 500 includes data storage devices 510A and 510B and movable carriage 502 (also referred to as carriage 502) disposed on a top surface of stage 540. Data storage devices 510A and 510B (collectively, data storage devices 510) include respective drive interconnects 512A and 512B (collectively, drive interconnects 512).

Figure 5A:
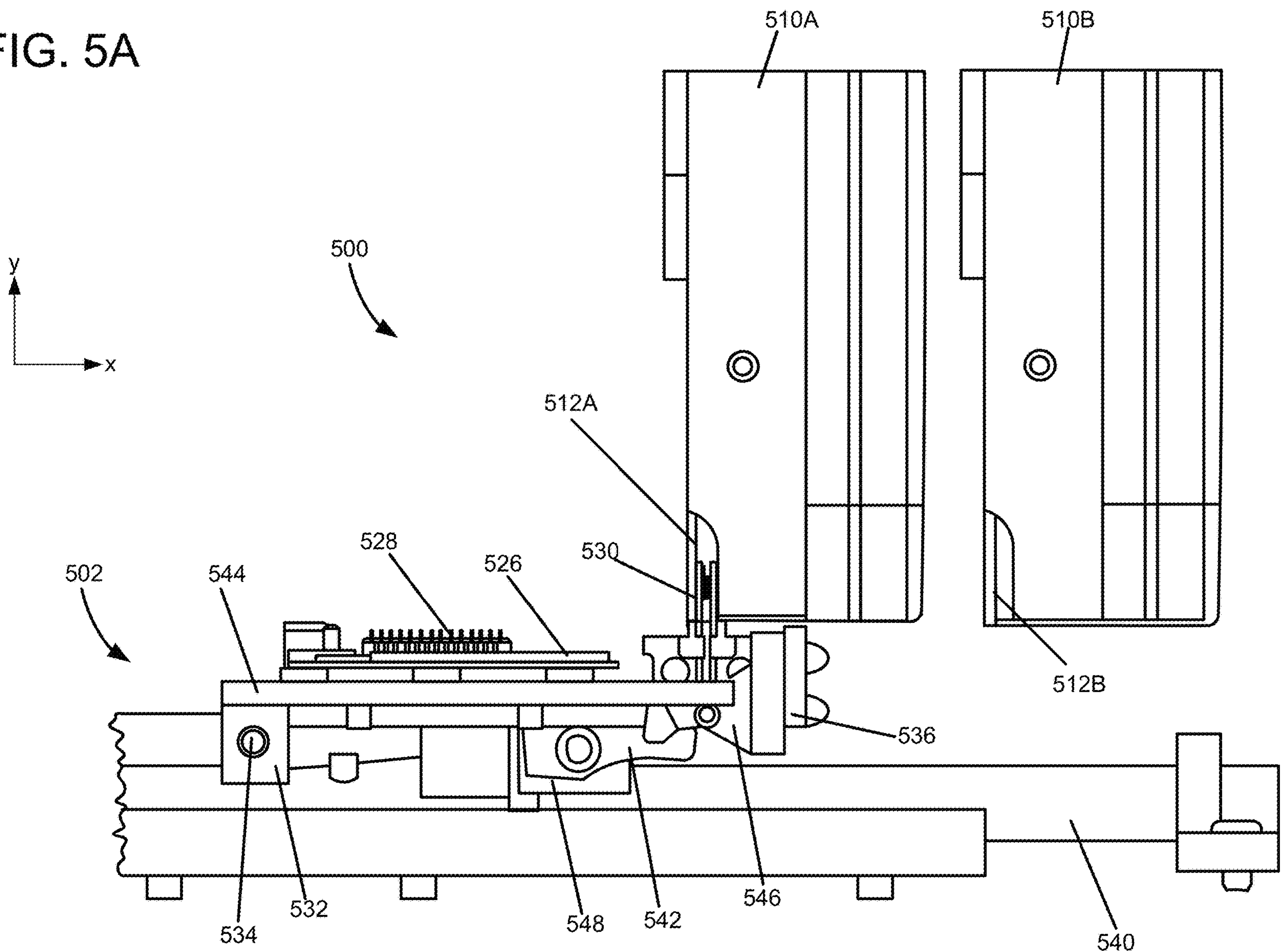
FIGS. 5A, 5B, 5C and 5D represent side views of a data storage apparatus including a movable carriage, in accordance with various aspects of the present disclosure.

Carriage 502 includes PCB 528 and carriage interconnects 530. In one example, PCB 528 is disposed on a top surface of carriage 502 and includes drive controller 526. In the example of FIG. 5A, carriage 502 is disposed beneath data storage devices 510A and 510B in a position that allows for physical and communicative coupling of carriage interconnects 530 with a first data storage device 510A via drive interconnects 512A.

In some examples, carriage 502 includes tilt bar hinge 532, tilt bar extension 544, and tilt bar backplate 536. Tilt bar hinge 532 defines tilt bar pivot point 534. In the example of FIGS. 5A-5D, tilt bar hinge 532 and tilt bar pivot point 534 are located on the distal side of carriage 502 that is opposite proximal side of carriage 502. Tilt bar backplate 536 may be located at the proximal side of carriage 502. Tilt bar extension 544 is physically coupled to tilt bar hinge 532 at a distal side of carriage 502. Tilt bar extension 544 couples with tilt bar backplate 536 at a proximal side of carriage 502. In other words, tilt bar extension 544 extends along the underside of carriage 502 and couples tilt bar backplate 536 to tilt bar hinge 532. In the example illustrated in FIG. 5A, tilt bar extension 544 is disposed parallel to stage 540.

Carriage 502 also includes tilt arm 542 and tilt arm motor 548 configured to rotate tilt bar extension 544 and tilt bar backplate 536 about tilt bar pivot point 534. In the example of FIG. 5A, a top surface of tilt arm 542 is physically coupled with a bottom surface of tilt bar tab (e.g., tilt bar tab 438 of FIGS. 4A and 4B).

FIG. 5A further represents carriage interconnects 530 in the "up" or "engaged" position. When carriage interconnects 530 are in the engaged position, carriage interconnects 530 communicatively and mechanically couple to drive interconnects 512A which allows data access operations (e.g., writing or reading of data) at data storage device 510A. In some instances, carriage interconnects 530 are configured to open and close. In such instances, carriage interconnects 530 may close and clamp onto drive interconnect 512A when carriage interconnects 530 are in the engaged position. For instance, carriage interconnects 530 may include a shaped memory alloy (SMA) that opens carriage interconnects 530 in response to receiving an electrical current and closes carriage interconnects 530 in the absence of an electrical current.

Figure 5B:
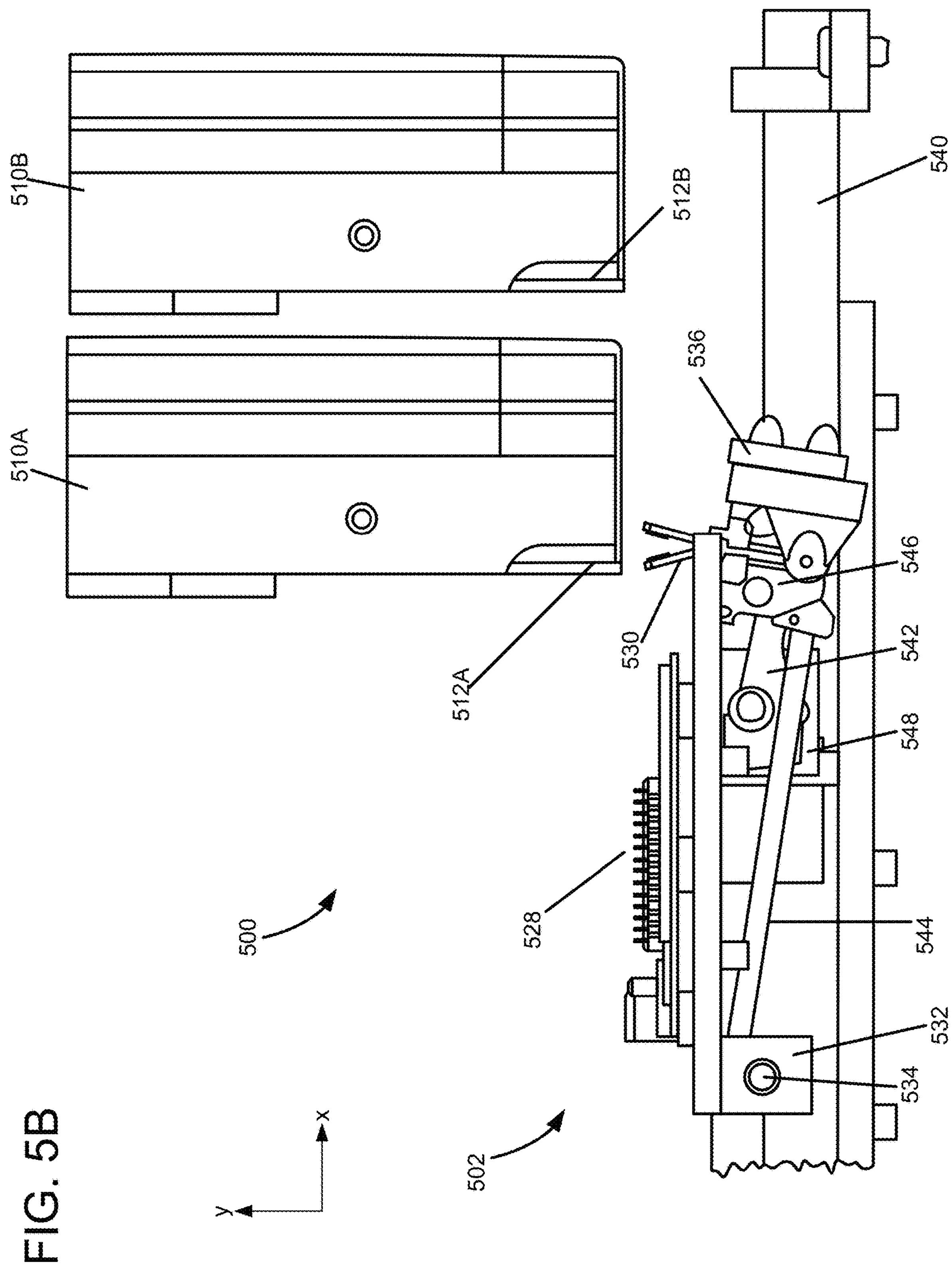
Figure 5C:
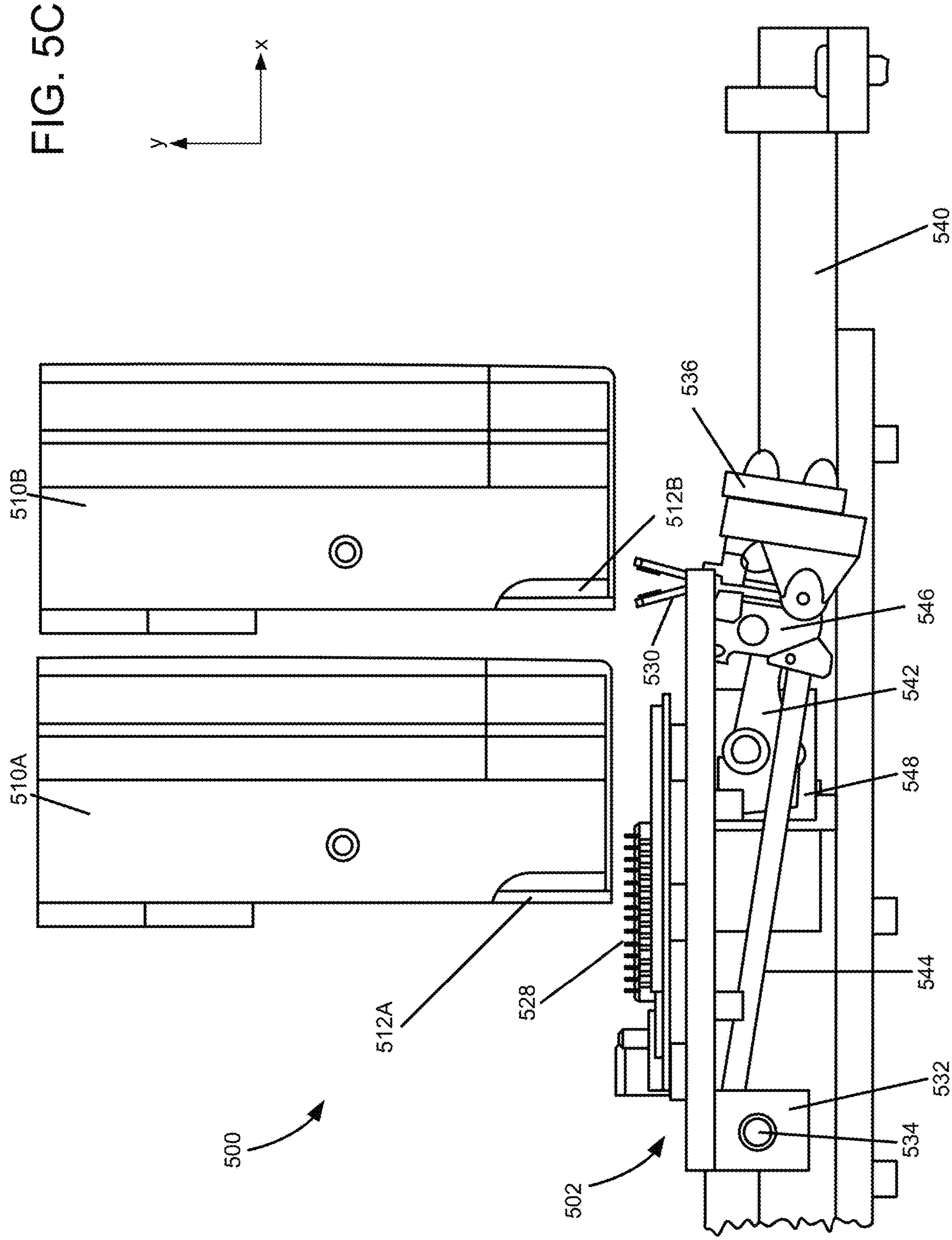
Figure 5D:
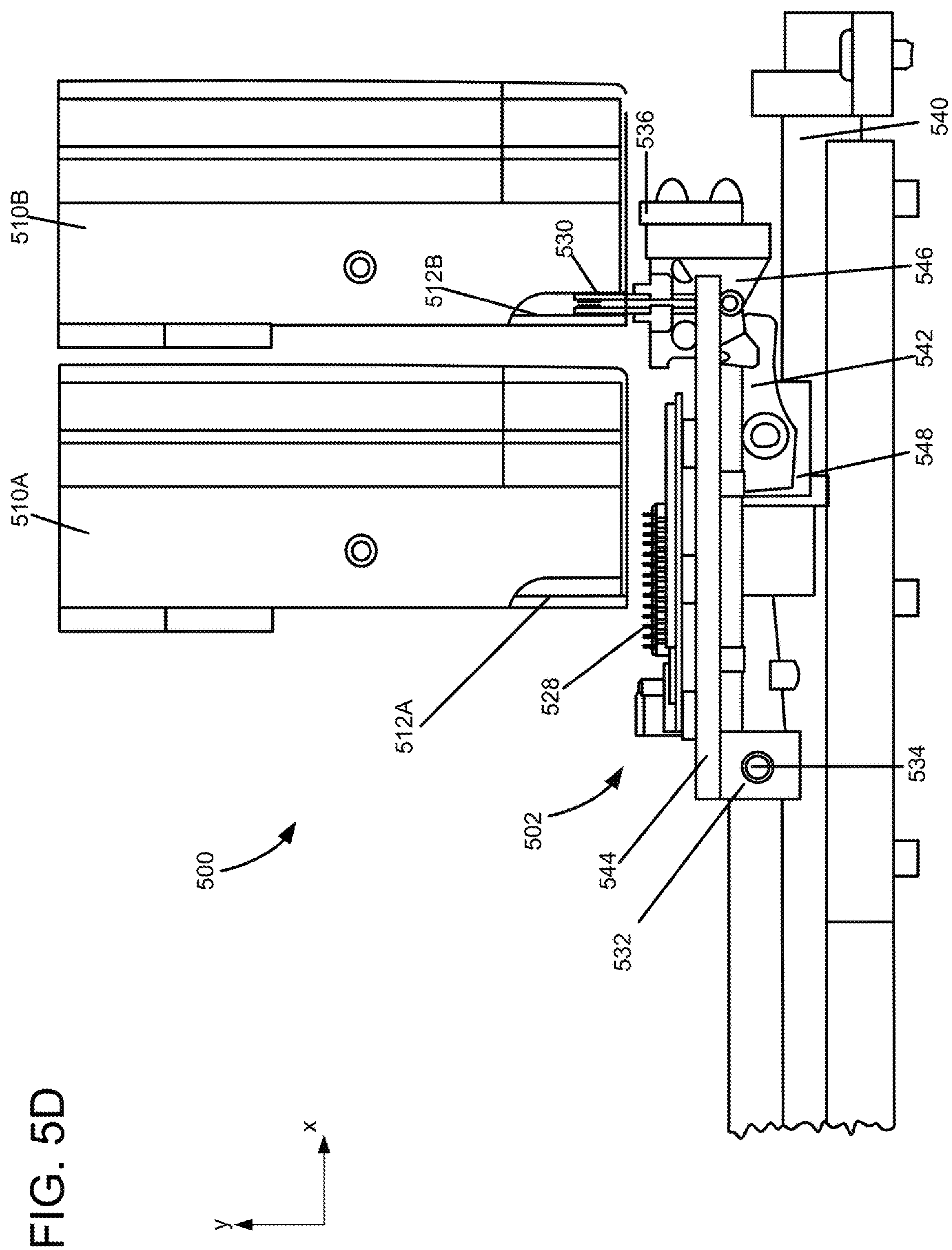

FIGS. 5B, 5C and 5D further describe the motion of carriage 502 during operation of data storage chassis 500. FIG. 5B represents an example of carriage 502 with carriage interconnects 530 in the "down" or "disengaged" position. Following completion of data access at data storage device 510A and in response to receipt of a command from a host (e.g., from a rack controller or other host), chassis controller 124 of FIG. 1 engages tilt arm motor 548 to rotate tilt arm 542 in a downward motion (in the negative y-direction of FIGS. 5A-5D) away from data storage device 510A. Rotating tilt arm 542 away from data storage device 510A causes tilt bar extension 544 to rotate in the negative-y direction, thus lowering carriage interconnects 530 away from data storage device 510A. In some instances, carriage interconnects 530 open to communicatively de-couple carriage interconnects 530 and drive interconnects 512A. For example, an SMA of carriage interconnects 530 may cease receiving an electrical current which may cause the carriage interconnects 530 to close.

In the example of FIG. 5C, actuation system 122 FIG. 1 causes carriage 502 to move along stage 540 (e.g., along a first axis in the X-direction) in response to receiving a command from a host. For example, actuation system 122 may cause carriage 502 to move from a position for accessing data storage device 510A to a position for accessing data storage device 510B. Said another way, moving carriage 502 from a first lateral position to a second lateral position aligns a plurality of carriage interconnects with a second plurality of drive interconnects of a second set of data storage devices. As carriage 502 is propelled across stage 540, carriage interconnects 530 remain physically and communicatively disengaged from both data storage device 510A and data storage device 510B. For example, lowering carriage interconnects 530 may enable carriage 502 to move under data storage devices 510 (e.g., between data storage devices 510 and a bottom surface of the housing of chassis 500) so as not to physically collide with data storage devices, or with any other component of the housing or chassis during motion.

Carriage 502 may move about stage 540 from a row that includes data storage device 510A and to another row that includes data storage device 510B. For example, as illustrated in FIGS. 5B and 5C, carriage 502 moves along stage 540 in the x-direction below data storage devices 510 (e.g., between data storage devices 510 and a bottom surface of housing of chassis 500). Such movement may include horizontal movement along a first axis and/or vertical movement along a second axis relative toward the target data storage device. In some examples, carriage interconnects 530 move approximately perpendicular (e.g., vertically) to the direction of travel of carriage 502. That is, carriage interconnects 530 may move vertically away from or towards data storage device 510 as tilt bar backplate 536 (and hence, carriage interconnects 530) rotate about pivot point 534.

FIG. 5D illustrates carriage interconnects 530 in the "up" or "engaged" position and physically and communicatively coupled to data storage device 510B. After carriage 502 moves along stage 540 to a position for physical and communicative coupling to data storage device 510B, chassis controller 124 of FIG. 1 engages tilt arm motor 548 which in turn rotates tilt arm 542 towards data storage device 510B (e.g., in an upward motion or in the y-direction). Rotating tilt arm 542 may cause a tilt bar tab (e.g., tilt bar tab 438 of FIGS. 4A and 4B) tilt bar extension 544 to rotate around tilt bar pivot point 534, thus moving carriage interconnects 530 to move vertically from a first vertical position to a second vertical position (e.g., in the y-direction) towards drive interconnects 512B. In some examples, carriage interconnects 530 physically and communicatively couple to drive interconnects 512B when tilt bar extension 544 is approximately parallel to stage 540. In one example, carriage interconnects 530 close around drive interconnect 512B (e.g., in response to a SMA of the carriage interconnects 530) receiving an electrical current. Data storage device 510B may perform data access operations (e.g., writing or reading of data) in response to communicatively coupling carriage interconnects 530 and drive interconnects 512B.

In one example, carriage 502 is configured to selectively couple with and provide data access to a single data storage devices at a time. In other examples, carriage 502 is adapted to simultaneously couple to multiple storage devices in a row (e.g., the rows illustrated in FIG. 2) and to provide parallel data access operations to two or more of those data storage devices.

Figure 6:
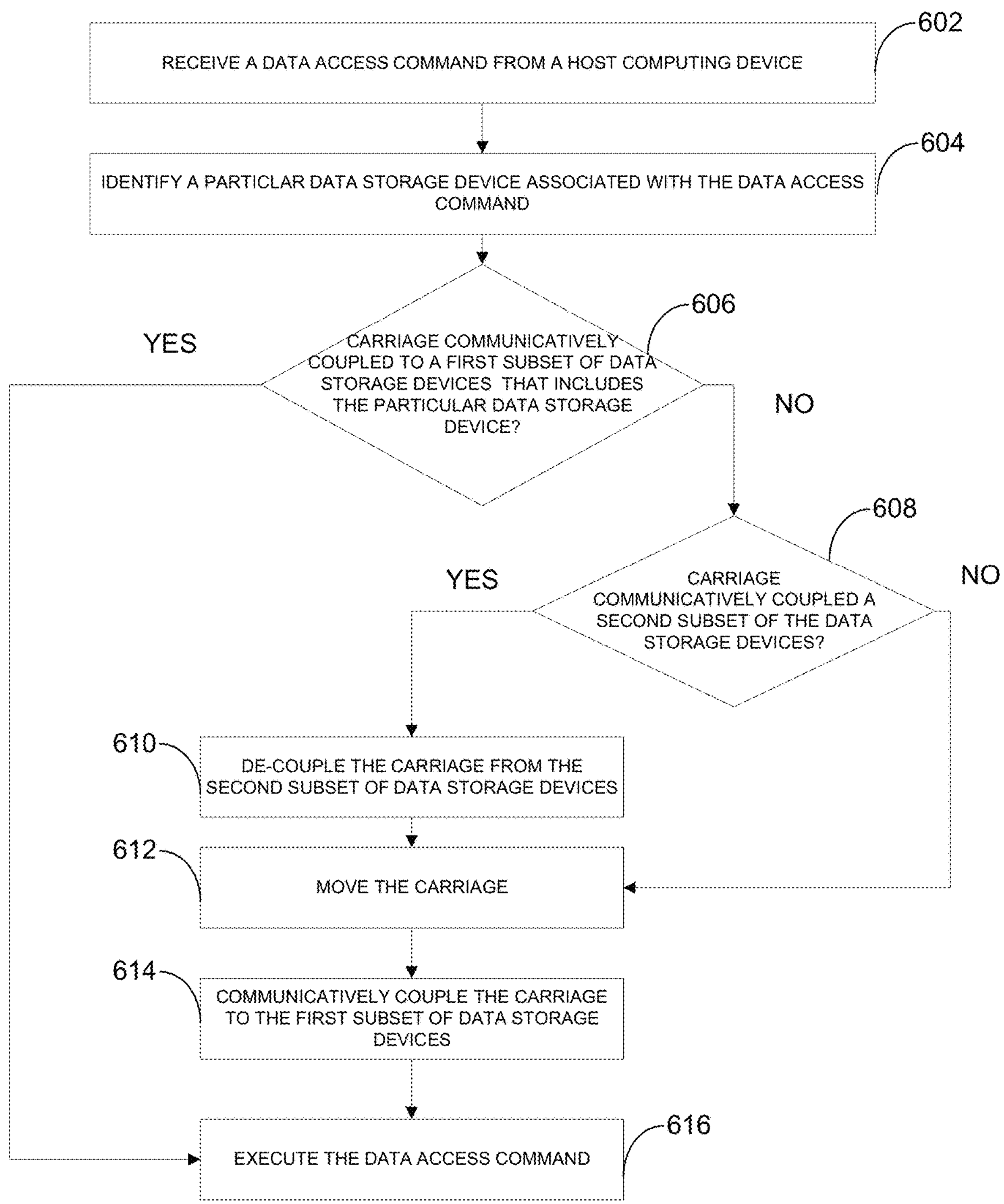
FIG. 6 is a flowchart illustrating example operations of an example data storage chassis, in accordance with various aspects of the present disclosure.

FIG. 6 is a flowchart illustrating example operations of an example data storage chassis, in accordance with various aspects of the present disclosure. FIG. 6 is described with reference to system 100 of FIG. 1 and chassis 206 of FIG. 2.

Chassis controller 124 receives a data access command from host computing system 102 (602). For example, chassis controller 124 may receive a read command or a write command from host computing system 102.

In some examples, chassis controller 124 identifies a particular data storage device of data storage devices 110 that is associated with the data access command (604). For example, chassis controller 124 may map the LBA included in the data access command to a physical block address (PBA) using a logical-to-physical block map. In one example, chassis controller 124 identifies the particular data storage device by determining which data storage device includes the mapped PBA (e.g., using a lookup table).

Chassis controller 124 determines whether carriage 120 is communicatively coupled to a first set of data storage devices 210 that includes the particular data storage device (606). For example, the first set of data storage devices may include a row of data storage devices coupled to or held by a single data storage magazine. In some scenarios, chassis controller 124 determines whether carriage 120 is communicatively coupled to the first set of data storage devices based on a lateral position of carriage 120 and/or a vertical position of carriage interconnects of carriage 120. Chassis controller 124 may determine a lateral position of carriage 120 along stage 140 and/or a vertical position of carriage interconnects 230). In some instances, chassis controller 124 determines the position of carriage 120 and/or carriage interconnects 230 based on one or more position sensors of actuation system 122, a position sensor or an amount of rotation of a motor (e.g., motor 242 or motor 448 of FIG. 4B).

Responsive to determining that carriage 120 is not communicatively coupled to the first set of data storage devices, chassis controller 124 determines whether carriage 120 is communicatively coupled to a second set of data storage device (608). For example, chassis controller 124 may compare the lateral and/or vertical position of carriage 120 to the lateral and/or vertical position of the second set of data storage devices.

Responsive to determining that carriage 120 is communicatively coupled to the second set of data storage devices, chassis controller 124 de-couples carriage 120 from the second set of data storage device (610). In one example, chassis controller 124 decouples carriage 120 from the second set of data storage devices by opening carriage interconnects 230. For example, carriage interconnects 230 may include an SMA such that chassis controller 124 opens carriage interconnects 230 by applying an electrical current through the SMA.

Chassis controller 124 moves carriage 120 to align the carriage interconnects of carriage 120 with the drive interconnects of the data storage device associated with the data access command (612). For example, chassis controller 124 may move carriage 120 in response to decoupling carriage 120 from the second set of data storage devices or in response to determining that carriage 120 is not coupled to first set of data storage devices. In some examples, chassis controller 124 outputs a command to motor 242 of FIG. 2 to cause carriage 120 to move about stage 140. Motor 242 moves carriage 120 in a lateral direction along stage 140 from one lateral position to another lateral position that aligns carriage interconnects 230 with drive interconnects 212 of the first set of data storage devices 110.

Chassis controller 124 communicatively couples carriage 120 to the first set of data storage devices (614). For example, chassis controller 124 couples carriage 120 to the first set of data storage devices by at least raising the plurality of carriage interconnects 230 from a first vertical position to a second vertical position. In one example, chassis controller 124 outputs a command to motor 448 causing motor 448 to rotate tilt bar backplate 436 and tilt bar extension 444 about tilt bar pivot point 434. In some examples, chassis controller 124 couples carriage 120 to the first set of data storage devices by clamping carriage interconnects 230 onto drive interconnects 212. For example, chassis controller 124 may clamp carriage interconnects 230 by ceasing the electrical current through an SMA of the carriage interconnects 230 to close the carriage interconnects 230.

The particular data storage device executes the data access command (616). For example, one or more drive controllers 226 receive the data access command and outputs a signal to particular data storage device 210 causing the particular data storage device to execute the data access command (e.g., to read or write data).

Figure 7:
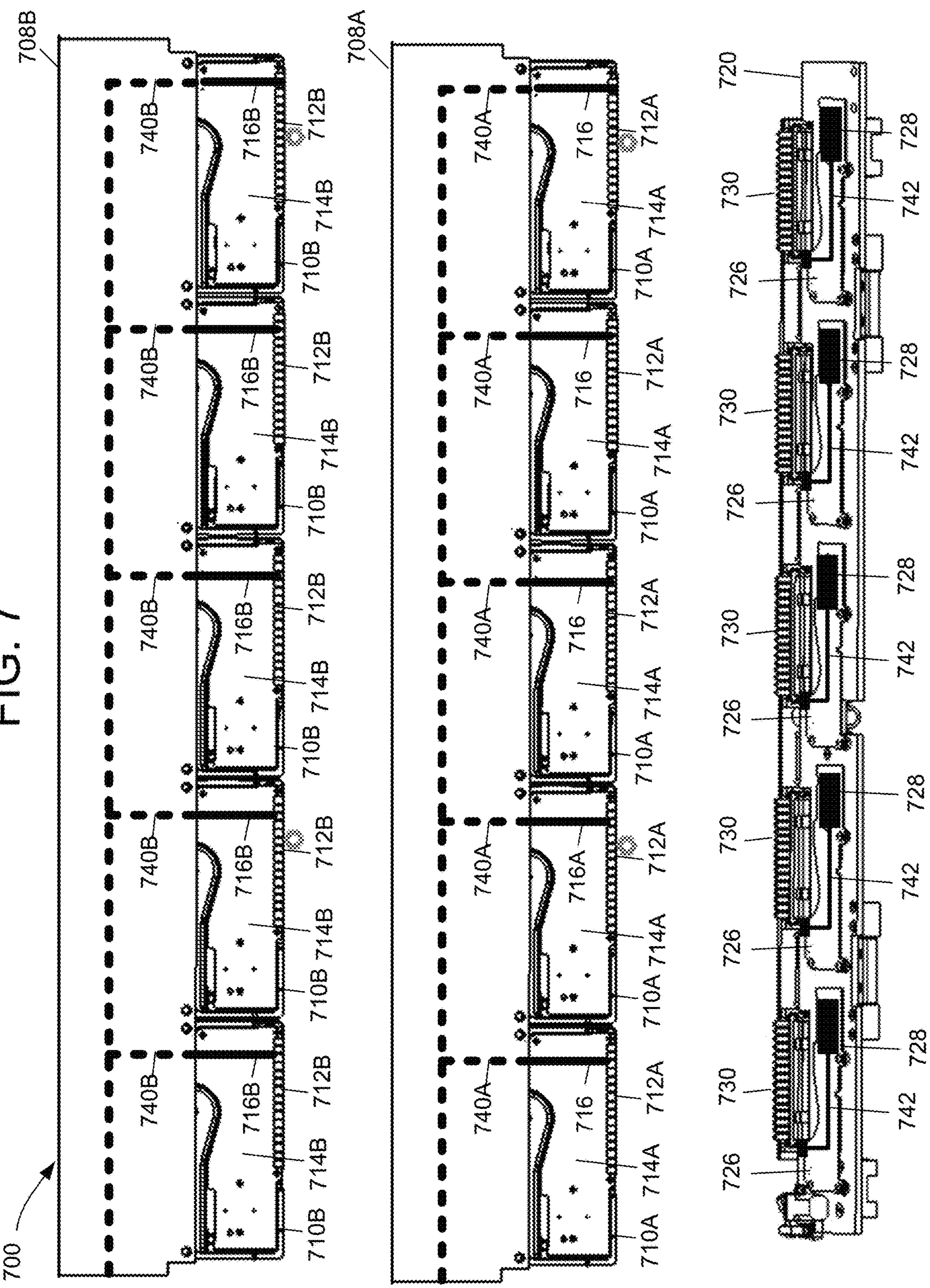
FIG. 7 is a perspective view of an example data storage system, according to various aspects of the present disclosure.

FIG. 7 is a perspective view of an example data storage system, according to various aspects of the present disclosure. In the example of FIG. 7, data storage system 700 includes a plurality of data storage magazines 708A and 708B (collectively, data storage magazines 708) and a carriage 720.

Carriage 720 includes a plurality of PCBs 726 and a plurality of carriage interconnects 730. In the example of FIG. 7, PCBs 726 includes drive controllers 728. In one example, PCBs 726 may represent interposers configured to transmit commands, data, and/or current between data storage devices 710 and a controller (e.g., chassis controller 124 of FIG. 1).

Data storage magazines 708A and 708B are configured to store a plurality of data storage devices 710A and 710B, respectively. Data storage devices 710A and 710B (collectively, data storage devices 710) each include a drive interconnect 712A and 712B, respectively, and a PCB 714A and 714B, respectively. Each of PCBs 714A and 714B (collectively, PCBs 714) include electrical traces 716A and 716B, respectively, that electrically couple PCBs 714 to mechanics and read/write circuitry internal to data storage devices 710. In the example of FIG. 7, PCBs 714 represent interposers configured to transmit commands, data, and/or current between the read/write circuitry of data storage devices 710 and drive controllers 728 of carriage 720. In one example, an interposer may not include a drive controller. In another example, PCBs 714 include drive controllers (e.g., rather than including the drive controllers on carriage 720).

In accordance with techniques of this disclosure, data storage system 700 includes two sets of signal paths configured to provide signals (e.g., electrical signals and/or optical signals) to each set of data storage devices 710. Each set of signal paths is configured to provide signals to the mechanics (e.g., spindle motors) of a set of data storage devices attached to a single data storage magazine.

In one example, data storage magazines 708A and 708B each include a set of magazine signal paths 740A and 740B (collectively, magazine signal paths 740). Magazine signal paths 740 may include electrical traces, conductive tapes, optical fiber, or other material configured to provide signals to data storage devices 710. In some scenarios, magazine signal paths 740 transmit electrical signals (e.g. current) along magazine signal paths 740 to the mechanics internal to data storage devices 710 to power the mechanics internal to data storage devices 710. In some scenarios, magazine signal paths 740 are configured to provide signal to the mechanics (e.g., spindle motors) of a set of data storage devices without providing current to the read/write circuitry (e.g., reader and/or writer) of the data storage devices.

In some examples, magazine signal paths 740 transmit optical signals to data storage devices 710. For example, data storage devices 710 may include a switch configured to electrically isolate the read/write circuitry and/or mechanics of data storage devices 710 from the controller. Electrically isolating read/write circuitry and/or mechanics of data storage devices 710 may increase security of data stored within data storage devices 710 even if data storage devices 710 are coupled to carriage 710.

Carriage 720 includes a set of carriage signal paths 742. In one example, each of carriage signal paths 742 includes a respective carriage interconnect of carriage interconnects 730. For example, signals may flow along carriage signal path 742 from one of drive controllers 728 to one of carriage interconnects 730. In some examples, carriage signal paths 742 are configured to provide signals to the mechanics and read/write circuitry of a set of data storage devices.

In operation, a controller (e.g., chassis controller 124 of FIG. 1) powers data storage devices 710A by selectively routing one or more signals to data storage devices 710A via magazine signal paths 740A or carriage signal paths 742. For example, the controller may power data storage devices 710A in response to receiving a data access command associated with data storage devices 710A from a host computing system (e.g., host computing system 102 of FIG. 1). The data access command may be associated with a set of data storage devices 710A when the data access command specifies an LBA that maps to a PBA of one of data storage devices 710A.

In some examples, the controller selectively routes the signals (e.g., electrical current) to data storage devices 710A along magazine signal paths 740A or carriage signal paths 742 based on whether carriage 720 is coupled to data storage devices 710A. That is, the controller may select between magazine signal paths 740A or carriage signal paths 742 based on whether carriage 720 is coupled to data storage devices 710A. In one example, the controller routes signals to data storage devices 710A along carriage signal path 742 when carriage 720 is coupled to data storage devices 710A. For example, when carriage interconnects 712 are electrically coupled to drive interconnects 712A, the controller routes signal via signal path 742 to the spindle motors and/or other mechanics of data storage devices 710A.

In one example, the controller receives another data access command associated with data storage devices 710B. The controller may determine whether carriage 720 is electrically coupled to data storage devices 710B. In some examples, the controller determines whether carriage 720 is electrically coupled to data storage devices 710B based on the lateral position of carriage 720 and/or attempting to sending a command to data storage devices 710B via signal paths 742. In one example, the controller may determine that carriage 720 is not electrically coupled to data storage devices 710B. For example, the controller may determine that carriage 720 is electrically coupled to data storage devices 710A.

The controller moves carriage 720 from a first lateral position to a second lateral position that aligns carriage interconnects 730 with drive interconnects 712B in response to receiving a data access command associated with one of data storage devices 710B and determining that carriage 720 is not electrically coupled to data storage devices 710B. For example, the controller may decouple carriage 720 from data storage devices 710A prior to moving carriage 720 to the second lateral position.

In some examples, the controller provides one or more signals to data storage devices 710A via magazine signal paths 740A prior to decoupling carriage 720 from data storage devices 710A. In one example, the controller adjusts a rotational speed of the spindle motors (and hence, the magnetic recording media) of data storage device 710A by providing a signal via magazine signal paths 740A. For example, the controller may provide an electrical signal (e.g., current) to the spindle motors of data storage devices 710A to slow down or "spin-down" data storage devices 710A. In one example, the controller decreases the rotational speed of the spindle motors, and hence the magnetic recording media, of data storage devices 710A to a target speed. For example, the controller may decrease the rotational speed of the magnetic recording media from an operational speed (e.g., a speed at which the magnetic recording media spin during data access operations, such as 5400 revolutions per minute (RPMs), 7200 RPMs, 15000 RPMs, etc.) to a target rotational speed by providing current to the spindle motors of data storage devices 710A via signal paths 740A. In some examples, the target rotational speed is an idle speed (e.g., 2500 RPMs) or a standstill (e.g., not rotating or 0 RPMs). In this way, the controller may de-couple carriage 720 from data storage devices 710A while the magnetic recording media "spins-down", such that the controller may move carriage 720 towards data storage devices 710B while the magnetic recording media of data storage devices 710A are still rotating. In this way, carriage 720 may couple to data storage devices 710B more quickly, which may increase the data throughput of system 700 by decreasing the time to read and/or write data to data storage devices 710B.

In some examples, the controller slows the rotational speed of the magnetic media to a standstill. In other words, the controller may brake the spindle motor and magnetic recording media causing the spindle motor and magnetic recording media to stop spinning. In one example, the controller may shunt an electrical current provided to the mechanics of data storage devices 710 to brake (e.g., stop) the spindle motor. In one example, data storage devices 710 may regeneratively brake the spindle motor such that energy captured while braking the spindle motor may be stored or used by other components of data storage devices 710 or data storage system 700.

In some examples, the controller routes signal to data storage devices 710B via signal paths 740B in response to determining that carriage 720 is not electrically coupled to data storage devices 710B. In one example, the controller increases the rotational speed of the magnetic recording media from a standstill to a target rotational speed by providing signal to data storage devices 710B via signal paths 740B. In this way, the controller may "spin-up" the magnetic recording media to the target rotational speed. The target rotational speed while the media spins up may be the same or different than the target rotational speed while the media spins down. In some instances, the target rotational speed while the magnetic recording media spins-up may be the idle speed or the operational speed. For example, the controller may increase the rotational speed of the magnetic recording media from a standstill (e.g., not rotating) to the operational speed by providing signal to a spindle motor of data storage devices 710B via signal paths 740B. In this way, the magnetic recording media of data storage devices 710B may "spin-up" such that the magnetic recording media is already spinning at the target speed prior when carriage 720 couples with data storage devices 710B. In this way, the controller may enable data storage devices 710B to perform data access operations more quickly than waiting to spin-up data storage devices 710B after coupling to carriage 720, which may reduce the time-to-data and increase the data throughput of system 700.

In some examples, the controller provides signal to data storage devices 710B via carriage signal paths 742 in response to coupling carriage 720 to data storage devices 710B. For example, the controller may provide signal to data storage devices 710B to power the mechanics (e.g., spindle motors) of data storage device 710B and cause the magnetic recording media to rotate (e.g., at the operational speed) without providing signal via magazine signal paths 740B. In one example, the controller increases the rotational speed of the spindle motors from the idle speed to the operational speed after coupling carriage 720 to data storage devices 710B.

In some examples, the controller continues to provide signal to the mechanics of data storage devices 710B via magazine signal paths 740B after physically coupling carriage interconnects 730 with drive interconnects 712B. For example, the controller may route signal to the spindle motors (e.g., to cause the magnetic recording media to rotate) via magazine signal paths 740B while routing signal to read/write circuitry of data storage devices 710B via carriage signal paths 742.

The controller may simultaneously provide signals to data storage devices 710A and 710B. In some examples, the controller routes signals to data storage devices 710A via magazine signal paths 740A while routing signals to data storage devices 710B via carriage signal paths 742, or vice versa. For example, the controller may continue to spin down data storage devices 710A by routing an electrical signal (e.g., current) to data storage devices 710A via magazine signal paths 740A after coupling carriage 720 to data storage devices 710B. In another example, the controller spins up data storage devices 710B by providing an electrical signal (e.g., current) to data storage device 710B via magazine signal paths 740B prior to decoupling carriage 720 from data storage devices 710A.

In one example, the controller simultaneously routes signals to mechanics of data storage devices 710A and 710B via magazine signal paths 740A and 740B. For example, the controller may provide current to the motor spindles of data storage devices 710A and 710B to increase the rotational speed of the motor spindles (thus spinning up the magnetic recording media) of data storage devices 710A while decreasing the rotational speed of the motor spindles (thus spinning down the magnetic recording media) of data storage devices 710B. In some scenarios, the controller may provide current to data storage devices 710A and 710B to maintain the motor spindles at an idle speed while carriage 720 is not coupled to either set of data storage devices 710A or 710B (e.g., when carriage 720 is not coupled to any set of data storage devices or is coupled to another set of data storage devices). In such scenarios, the controller may cause all the data storage devices that are not performing data access operations to remain at an idle speed without stopping the rotation of the magnetic recording media, which may increase the lifespan of the data storage device by reducing how often spindle motor causes the magnetic recording medium spin-up and spin-down.

Figure 8:
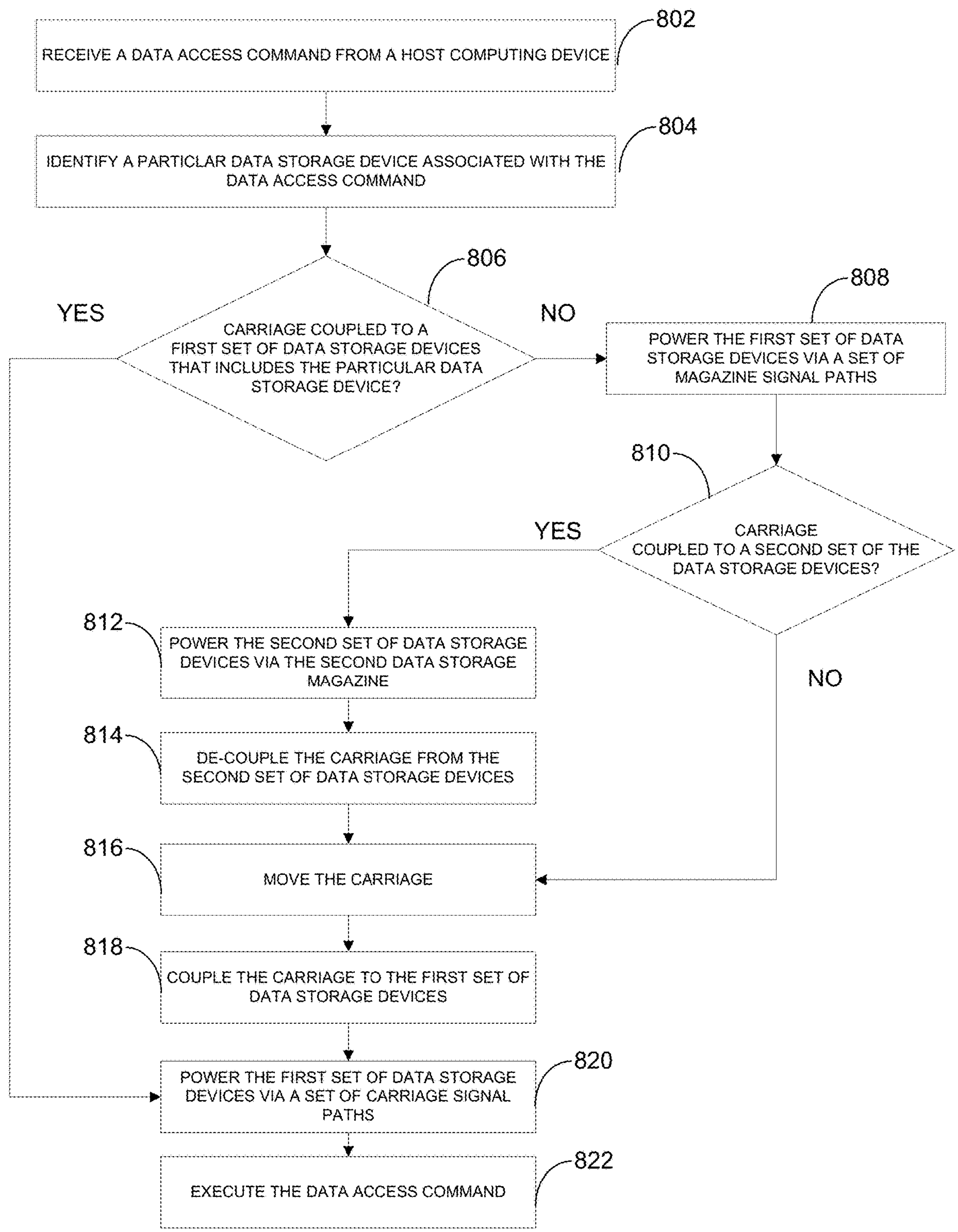
FIG. 8 is a flowchart illustrating example operations of an example data storage system, in accordance with various aspects of the present disclosure.

FIG. 8 is a flowchart illustrating example operations of an example data storage system, in accordance with various aspects of the present disclosure. FIG. 8 is described with reference to system 100 of FIG. 1 and system 700 of FIG. 7.

A chassis controller (e.g., chassis controller 124 of FIG. 1) receives a data access command from host computing system 102 (802). For example, the chassis controller may receive a read command or a write command from host computing system 102.

In some examples, chassis controller 124 identifies a data storage device of data storage devices 710A that is associated with the data access command (804). For example, chassis controller 124 may map the LBA included in the data access command to a physical block address (PBA) using a logical-to-physical block map. In one example, chassis controller 124 identifies the data storage device by determining which data storage device includes the mapped PBA (e.g., using a lookup table).

Chassis controller 124 determines whether carriage 720 is electrically coupled to a set of data storage devices 710A that includes the identified data storage device (806). In some scenarios, the chassis controller determines whether carriage 720 is electrically coupled to the set of data storage devices 710A based on a lateral position of carriage 720 and/or a vertical position of carriage interconnects of carriage 720.

Responsive to determining that carriage 720 is not electrically coupled to data storage devices 710A, chassis controller 124 provides signals to the mechanics of data storage devices 710A via magazine signal paths 740A (808). In one example, chassis controller 124 adjusts a rotational speed of the spindle motors (and hence, the magnetic recording media) of data storage device 710A by providing current via magazine signal paths 740A. In one example, chassis controller 124 increases the rotational speed of the magnetic recording media from a standstill or current speed to a target rotational speed (e.g., an idle speed or an operational speed) by providing current to data storage devices 710A via signal paths 740A. In this way, the magnetic recording media of data storage devices 710B may "spin-up" such that the magnetic recording media is already spinning at the target speed when carriage 720 couples with data storage devices 710B.

In the example of FIG. 8, chassis controller 124 determines whether carriage 720 is electrically coupled to a second set of data storage device 710B (810). Responsive to determining that carriage 720 is electrically coupled to data storage devices 710B, chassis controller 124 powers data storage devices 710B via a second set of magazine signal paths 740B of data storage magazine 708B (812). In one example, chassis controller 124 powers data storage devices 710B by routing current to data storage devices 710B via magazine signal paths 740B.

The chassis controller electrically decouples carriage 720 from the data storage devices 710B (814). For example, chassis controller 124 may disconnect carriage interconnects 730 from drive interconnects 712B.

In one example, chassis controller 124 moves carriage 720 to align the carriage interconnects of carriage 720 with the drive interconnects 712A of the data storage devices 710A (816). For example, chassis controller 124 may move carriage 720 in response to decoupling carriage 720 from the second set of data storage devices or in response to determining that carriage 720 is not coupled to any of data storage devices 710.

Chassis controller 124 electrically couples carriage 720 to data storage devices 710A (818). For example, chassis controller 124 couples carriage 720 to data storage devices 710A by at least raising the plurality of carriage interconnects 230 from a first vertical position to a second vertical position.

In the example of FIG. 8, chassis controller 124 powers data storage devices 710A via a set of carriage signal paths 742 of data storage magazine 708A in response to coupling carriage 720 to data storage devices 710A (820). For example, chassis controller 124 may route current to the mechanics and read/write circuitry of data storage devices 710A via carriage signal paths 742.

One or more of data storage devices 710A executes the data access command (822). For example, one or more drive controllers 728 receive the data access command and outputs a signal to one of data storage devices 710A causing the data storage devices 710A to execute the data access command (e.g., to read or write data).

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" features or steps need not necessarily appear in that order, and the embodiments thereof need not necessarily be limited to three features or steps. It should also be understood that the singular forms of "a," "an," and "the" include plural references unless the context clearly dictates otherwise. Spatially relative terms such as "above", "below", "upper", "lower", "proximal", "distal", "left", and "right", among other spatially relative terms, may be used to describe one feature's relationship to another feature as illustrated in the figures.

Various examples have been presented for the purposes of illustration and description. These and other examples are within the scope of the following claims.

What is claimed is:

1. An apparatus comprising:

a housing;

a data storage magazine configured to hold a plurality of data storage devices, the data storage magazine including a set of magazine signal paths configured to provide signals to the plurality of data storage devices;

a movable carriage disposed within the housing, the movable carriage configured to selectively couple the data storage devices to a host device and including a set of carriage signal paths configured to provide signals to the plurality of data storage devices; and a controller configured to power the plurality of data storage devices by selectively routing a signal via the set of magazine signal paths or the set of carriage signal paths.

2. The apparatus of claim 1, wherein the controller is configured to selectively route the signal by being configured to route the signal to the plurality of data storage devices via the set of magazine signal paths when the carriage is not coupled to the plurality of data storage devices.

3. The apparatus of claim 2, wherein the plurality of data storage devices each include magnetic recording media and a spindle motor configured to rotate the magnetic recording media, and wherein the controller adjusts a rotational speed of the magnetic recording media by routing the signal via the set of magazine signal paths.

4. The apparatus of claim 1, wherein the controller is configured to selectively route the signal by being configured to route the signal to the plurality of data storage devices via the set of carriage signal paths when the carriage is coupled to the plurality of data storage devices.

5. The apparatus of claim 1, wherein the data storage magazine is a first data storage magazine, the plurality of data storage devices is a first plurality of data storage magazines, the set of magazine signal paths is a first set of magazine signal paths, and the signal is a first signal, the apparatus further comprising:

a second data storage magazine configured to hold a second plurality of data storage devices, the second data storage magazine including a second set of magazine signal paths configured to provide a second signal to the second plurality of data storage devices, wherein the controller is further configured to route the second signal to the second plurality of data storage devices via the second set of magazine signal paths while routing the first signal to the first plurality of data storage devices.

6. The apparatus of claim 5, wherein the controller is configured to route the second signal to the second plurality of data storage devices while routing the first signal to the first plurality of data storage devices via the set of carriage signal paths.

7. The apparatus of claim 5, wherein the controller is configured to route the second signal to the second plurality of data storage devices while routing the first signal to the first plurality of data storage devices via the first set of magazine signal paths.

8. The apparatus of claim 5, wherein the controller is configured to:

decouple the movable carriage from the first plurality of data storage devices;

provide the first signal to the first plurality of data storage devices via the first set of magazine signal paths after decoupling the movable carriage from the first plurality of data storage devices;

provide the second signal to the second plurality of data storage devices via the second set of magazine signal paths while moving the movable carriage from a first lateral position to a second lateral position, couple the movable carriage to the second plurality of data storage devices; and provide the second signal to the second plurality of data storage devices via the set of carriage signal paths after coupling the movable carriage to the second plurality of data storage devices.

9. The apparatus of claim 8, wherein each data storage device of the first plurality of data storage devices includes magnetic recording media and a spindle motor configured to rotate the magnetic recording media, and wherein the controller is configured to decrease a rotational speed of the magnetic recording media by providing the first signal to the first plurality of data storage devices via the first set of magazine signal paths after decoupling the movable carriage from the first plurality of data storage devices.

10. The apparatus of claim 8, wherein each data storage device of the second plurality of data storage devices includes magnetic recording media and a spindle motor configured to rotate the magnetic recording media, and wherein the controller is configured to increase a rotational speed of the magnetic recording media by providing the second signal to the second plurality of data storage devices via the second set of magazine signal paths prior to coupling the movable carriage from the second plurality of data storage devices.

11. The apparatus of claim 1, wherein the data storage magazine includes a printed circuit board that includes the set of magazine signal paths.

12. A method comprising:

while a movable carriage is decoupled from a plurality of data storage devices held by a data storage magazine, providing current to the plurality of data storage devices via a set of magazine signal paths of the data storage magazine;

coupling the movable carriage to the plurality of data storage devices; and responsive to coupling the movable carriage to the plurality of data storage devices, providing the current to the plurality of data storage devices via a set of carriage signal paths of the movable carriage.

13. The method of claim 12, wherein providing the current to the plurality of data storage devices via the set of magazine signal paths includes adjusting a rotational speed of magnetic recording media of the plurality of data storage devices.

14. The method of claim 13, wherein adjusting the rotational speed of the magnetic recording media includes increasing the rotational speed from an idle speed or a standstill to an operational speed at which the plurality of data storage devices are configured to perform read operations or write operations.

15. The method of claim 12, wherein the data storage magazine is a first data storage magazine, the plurality of data storage devices is a first plurality of data storage devices, and the set of magazine signal paths is a first set of magazine signal paths, the method further comprising:

prior to coupling the movable carriage to the first plurality of data storage devices:

providing a second current to a second plurality of data storage devices via the set of carriage signal paths of the movable carriage;

decoupling the movable carriage from the second plurality of data storage devices; and providing the second current to the second plurality of data storage devices via a second set of magazine signal paths of a second data storage magazine after the movable carriage is decoupled from the second plurality of data storage devices.

16. The method of claim 15, wherein providing the second current to the second plurality of data storage devices via the second set of magazine signal paths includes decreasing a rotational speed of magnetic recording media of the second plurality of data storage devices.

17. The method of claim 15, further comprising:

moving the movable carriage from a first location to a second location, wherein the first location aligns a set of carriage interconnects of the movable carriage with a set of drive interconnects of the first plurality of data storage devices, wherein the second location aligns the set of carriage interconnects of the movable carriage with a set of drive interconnects of the second plurality of data storage devices, wherein providing the first current to the first plurality of data storage devices via the first set of magazine signal paths includes simultaneously providing the second current to the second plurality of data storage devices via the second set of magazine signal paths while moving the movable carriage from the first location to the second location.

18. The method of claim 15, further comprising:

braking the magnetic recording media of the second plurality of data storage devices by shunting the second current after providing the second current to the second plurality of data storage devices.

19. The method of claim 12, wherein providing the current to the plurality of data storage devices via the magazine signal paths includes providing the current to a plurality of spindle motors configured to rotate magnetic recording media of the data storage devices without providing the current to the read/write circuitry of the plurality of data storage devices.

20. A device comprising:

a processor;

a memory comprising instructions that, when executed by the processor, cause the processor to:

selectively route current to a plurality of data storage devices held by a data storage magazine by:

routing the current via a set of carriage signal paths of a movable carriage when the movable carriage is coupled to the plurality of data storage devices; and routing the current via a set of magazine signal paths of the data storage magazine when the movable carriage is not coupled to the plurality of data storage devices.

* * * * *